United States Patent [19]

Licht

[11] 4,277,519
[45] Jul. 7, 1981

[54] SIMULTANEOUS FORMATION OF GARNET EPILAYER ON A PLURALITY OF SUBSTRATES

[75] Inventor: Steven J. Licht, Warren Township, Somerset County, N.J.

[73] Assignee: Bell Telephone Laboratories, Incorporated, Murray Hill, N.J.

[21] Appl. No.: 122,597

[22] Filed: Feb. 19, 1980

Related U.S. Application Data

[63] Continuation of Ser. No. 939,062, Sep. 1, 1978, abandoned.

[51] Int. Cl.³ .............................................. B05D 5/12
[52] U.S. Cl. .................................. 427/129; 427/128; 427/130
[58] Field of Search .............................. 427/127–132, 427/48

[56] References Cited

U.S. PATENT DOCUMENTS 3,486,937 12/1969 Linares .

Primary Examiner—Bernard D. Pianalto
Attorney, Agent, or Firm—Bruce S. Schneider

[57] ABSTRACT

A specific set of processing steps in the batch production of garnet epilayers yields excellent quality and reproducibility. The process requires (1) agitation of the melt before growth, (2) heat stabilization of the substrates upon extraction from the melt, and (3) extraction from the melt so that the major surfaces of the substrates leave the melt at an angle to the melt surface. Use of these processing steps avoids defects common to batch processing such as fracture of a fraction of the substrates, sever non-uniform properties through the epilayers, and mesa formation on the epilayer.

9 Claims, 3 Drawing Figures

SIMULTANEOUS FORMATION OF GARNET EPILAYER ON A PLURALITY OF SUBSTRATES

This application is a continuation of application Ser. No. 939,062, filed Sept. 1, 1978 now abandoned.

BACKGROUND OF THE INVENTION

1. Field of the Invention

This invention relates to growth of epitaxial layers and, more particularly, to the growth of garnet epitaxial layers.

2. Art Background

Magnetic bubble wafers are presently being used in memory devices for various commercial applications. Of the numerous steps required to produce a finished device, one of the most significant in determining device properties is the growth of an epilayer of magnetic garnet material on an appropriate substrate. Since commercial use of magnetic bubble devices appears to be increasing, efficient epitaxial growth methods are essential. Unfortunately, difficulties are encountered in the growth of epilayers even when processing a single substrate. These difficulties remain and indeed are considerably magnified by an attempt simultaneously to coat a plurality of substrates.

The predominate difficulties associated with the growth of an epilayer on a single substrate are mesa and microcrystalline formation. The formation of these defects substantially degrade the quality of the ultimate magnetic bubble device. Mesa defects are irregularities in the epilayer which typically project between 0.2 $\mu$m and 20 $\mu$m above the epilayer surface. Microcrystals are crystalline phase discontinuities on the surface or in the body of the epilayer having essentially the same composition as the epilayer and usually having dimensions of 0.5 $\mu$m to 50 $\mu$m.

Various processes are utilized to avoid formation of these defects. The most common method of limiting mesa formation is by spinning the substrates shortly after they emerge from the melt. Although spinning has had moderate success, mesa defects located near the center of the substrate are not substantially affected. Attempts have been made to reduce mesa formation further by growing the epilayers with the substrates at an angle to the surface of the melt. It was hypothesized that when the epitaxial layers were grown at a slight tilt (5 degrees) and the substrates emerge from the melt at this same tilt subsequent spinning would be more effective in reducing mesa formation, Gies et al, *IBM Technical Disclosure Bulletin*, 16 (9), 3049 (1974). This approach, however, causes serious non-uniformity in the epilayer thickness on each substrate which is far more disadvantageous than mesa formation. Irrespective of the cause of mesa formation they produce a lowered yield of acceptable devices.

The second possible serious defect, microcrystalline formation, depends on the processing condition, such as the degree of supercooling of the melt. Attempts to reduce microcrystalline formation usually involve adjusting the process parameters. For example, the substrates are preheated before immersion in the growth melt to prevent formation of crystals in the melt which ultimately are incorporated in the epilayer. Additionally the melt is carefully thermally re-equilibrated between growth runs to avoid microcrystals. When one substrate or only a few substrates are processed in a single run it is impractical, if a satisfactory production rate is to be achieved, to take these time consuming precautions (such as re-equilibration between runs). Therefore microcrystalline defects usually persist in one substrate processing and result in a lowering of the yield of acceptable devices.

In an attempt to increase efficiency and to make feasible the time consuming precautions against microcrystalline formation which are unacceptable during single substrate deposition, multiple substrate processing has been investigated. The simultaneous processing of a number of substrates, however, magnifies the problems encountered with single substrate processing and additionally introduces new difficulties. When a multiplicity of substrates are processed, they are stacked horizontally in a column with an average spacing between growth surfaces of about 1 cm. When the column is inserted in the melt, these spaces confine the flow of the growth melt around the substrate and in turn increase the amount of melt remaining on the eiplayer when it is extracted from the growth media. After extraction the additional melt continues localized growth of the epilayer and produces mesas. The spinning method is also employed in multiple substrate processes to eliminate the extra melt and the resultant mesas. Nevertheless, the additional melt left upon extraction from the melt body naturally leads to an increase in mesas remaining after spinning. Microcrystalline defects also appear to be more numerous when a plurality of substrates are being processed if process parameters are not closely controlled.

The increase of defects such as mesa and microcrystalline formation in multisubstrate processing is accompanied by other equally disadvantageous phenomenon. For example, an inordinate frequency of substrate breakage particularly for substrates in the lower section of the substrate column has been observed. This breakage problem causes the affected substrates to drop into the growth melt. The dissolution of the substrate in the melt changes the melt composition and precludes the further use of the melt for epitaxial layer growth.

The epilayer uniformity is also much more difficult to control in multiple substrate processing. Variations greater than 9% in thickness and 13% in magnetic properties between the top and bottom substrate of only an eight substrate column are often observed. (See Warren et al, *American Institute of Physics*, 19th Conference on Magnetism and Magnetic Materials, Boston, November 1973.)

The aggregation of the problems introduced by multiple substrate processing together with the magnification of problems normally associated with the growth of a single epitaxial layer substantially decreases the yield of useful epitaxial layers for device fabrication. This decreased yield in view of the substantial cost of the substrates is an obstacle to efficient, economic magnetic bubble device fabrication.

SUMMARY OF THE INVENTION

The problems associated with both single substrate and multiple substrate processing are eliminated or significantly diminished by the practice of a specific set of processing steps. This set of steps involves the stirring of the growth melt before immersion of the substrates and preferably also during the growth process, growth with the major surface of the substrate parallel to the melt surface but removal of the substrates from the melt so that the major surface of the substrates emerge at an angle to the surface of the melt, and the removal of the substrates from the growth melt utilizing a heat shielding means which reduces the temperature gradient across the lower substrates. These steps when combined with the usual precautions, such as post growth spinning and preimmersion heating, substantially reduce mesa and microcrystalline formation and substrate cracking. The combination of steps leads to more consistent layer thicknesses and magnetic properties. Thus, a number of the barriers to efficient production of epitaxial coated garnet substrates suitable for magnetic bubble device fabrication are removed.

Additionally, it has been found that surface irregularities other than mesas, are substantially reduced by using structural members having acute edges in constructing the holder for the substrates. The physical protection of the bottom substrates from the melt before immersion has also eliminated pitting of these substrates.

DETAILED DESCRIPTION

The individual composition of the garnet substrates is not critical to the process. In a preferred embodiment cleaned and polished substrates having the composition represented by the formula $Gd_3Ga_5O_{12}$ with a 0.20 mil thickness, are inserted in the substrate holder. (One horizontal support member is removal for insertion of the substrates.) It is desirable that the substrates be rigidly clamped during the growth process. The substrate holder is designed with structural members having sharp corners. The exact cross-sectional geometry of these members is not critical but members with square cross-section have been shown to be advantageous. (It is desirable to minimize the mass of these members consistent with structural integrity to keep the thermal mass of the holder as low as possible.) These members (34 in FIGS. 2 and 3) have been slotted as an expedient for holding the substrates. It is important that the substrates are held rigidly during processing. This is expediently done by using substrates having a flat which is engaged by a holder slot, 47, so that rotation is effectively eliminated. The spacing of the slots, and thus the spacing of the substrates, is important to uniform epitaxial growth. This spacing has been discussed elsewhere. (See R. L. Warren et al, *American Institute of Physics*, 19th Conf. on Magnetism and Magnetic Materials, Nov. 1973, Boston.) Briefly, substrates are held in pairs with a minor spacing, 35, between substrate pairs and a major spacing, 36, between each pair. Typically, the minor spacing is between 20 mil and 50 mil, preferably between 0.20 mil and 25 mil. Larger minor spacings are possible but inconvenient. The major spacings are usually greater than 0.8 cm, preferably between 0.8 cm and 1 cm. Space and furnace design limitation make it advantageous to process 18 to 30 substrates simultaneously when using the preferred major spacings.

Figure 1:
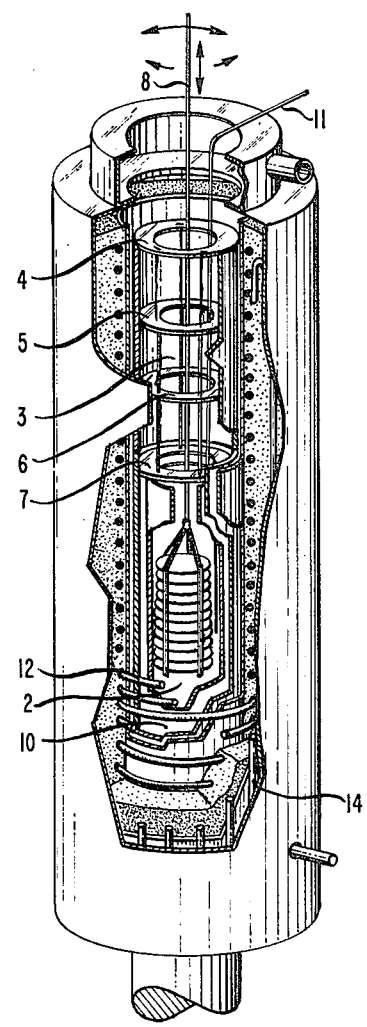
FIG. 1 is a schematic of furnace useful for multisubstrate epitaxial growth.

Once the substrate holder is loaded, it is attached to the transport means of the growth apparatus. This transport means provides for lowering and raising the substrates relative to the growth melt 2 (FIG. 1). After the substrates are attached to the transport means, they are lowered into an area above the melt denoted 3. (The melt is a supercooled mixture which yields the desired composition in the epitaxial layer. For most garnet materials, the composition of the melt which provides a given epitaxial layer composition is a complicated function of numerous equilibrium processes. The exact ratios of melt compositions to provide a desired epitaxial layer of composition has been determined for the more common magnetic garnet materials. The compositions used in turn determines the temperature of the supercooled melt.) In the area above the melt the substrates are preheated to the melt temperature or to slightly above the melt temperature. Since the substrates block the escape of heat from the furnace, this preheating occurs naturally by convection from the melt when the substrates are kept just above the melt for a period of from 5 min to 15 min preferably 5 to 8 min.

During the preheating process the bottom substrate is exposed to vapors emanating from the melt. These vapors include predominantly solvent compounds used in dissolving the compounds eventually incorporated into the epitaxial layer. It has been found that if these solvent compounds, such as PbO, are present on the substrate in liquid form, pits are formed through dissolution of the substrate material in the solvent. This disadvantageous pitting is essentially avoided by preventing the formation of liquid solvent on the substrates. Two preferred methods have been utilized to accomplish this goal. First a baffle or shielding means, denoted 38 is inserted below the bottom substrate. The vapor condenses on this shielding means and significantly reduces condensation on the bottom substrate. In a second method (which is compatible with the first) the preheating process is utilized as a means of preventing liquefication of solvent on the substrate. Initially when the substrates are introduced into the preheating zone the solvent condenses on the substrate as a solid. Then, if the temperature during the preheating process is carefully controlled, this solid solvent will sublime and formation of liquid is avoided. The temperature control is achieved by inserting baffles 4, 5, 6, and 7 into the furnace area above the melt and adjusting their position relative to the melt to yield a thermal geometry which induces sublimation of the solvent. The exact position of the baffles depends on the growth temperature of the melt and is determined by a controlled sample.

Before the immersion of the preheated substrates into the growth melt, the melt should be mixed. The method of mixing is not critical, but is conveniently done with a stirrer, 39, which is attached to the bottom of the substrate holder. (If a baffle is used, the stirrer is advantageously attached directly to the bottom of this baffle.) When the attached stirrer is utilized, the substrate holder is lowered until the stirrer, but not the bottom substrate is immersed in the melt. The substrate holder is then rotated at a speed of between 50 rpm and 100 rpm for a period between approximately 1 and 10 minutes. It is believed that this mixing prevents inhomogeneity which is a substantial cause of layer thickness and magnetic property fluctuations. Thus, the mixing should be sufficient to substantially eliminate thermal and compositional inhomogeneities—produce homogeneity to within 0.3%. After mixing, irrespective of the means utilized, the substrates are immersed in the melt. It is desirable that during the growth process which ensues some mixing of the melt be continued. The means used for this continued mixing is again not critical.

As reported in previous work, the substrates are moved in an oscillatory motion during growth. This oscillation has been found to improve the uniformity of the epitaxial layer. Typically, the substrates are rotated through 360 degrees at 50 to 150 rpm, with a direction reversal every revolution. (It should be noted when a stirrer is attached to the baffle, mixing of the melt is a direct consequence of the oscillatory movement.) For most epitaxial compositions growth continues generally for a period between 0.25 and 10 minutes, depending on the thickness desired and on the extent the melt is supercooled. For example, if a 3 μm thick layer resulting from a melt which is supercooled about 20 degrees C. is deposited, a growth period of 3 min is appropriate. If a 4 μm thick layer is desired, a suitable growth period is 4 min. After growth the substrates are removed from the melt. This removal is done so that the major surface of the substrate, i.e., the surface having the epitaxial coating, emerges at an angle to the surface of the melt. To achieve this angle it has been found convenient to tilt the furnace and the substrates thus causing the substrates to be skewed relative to the surface of the melt. To produce noticeable results, angles between the melt surface and the major surface of the substrates greater than 10 degrees are necessary. Although a 90 degree angle is desirable, design considerations usually limit the angle to those less than 20 degrees. It should be noted that the substrates and furnace must not be tilted before epitaxial growth has been finished. If the oven is prematurely tilted non-uniform thicknesses are promoted.

After the substrates are removed at an angle, they are straightened relative to the earth and spun as in the prior art method. Rotation speeds of between 500 rpm and 1000 rpm are suitable. Rotation speed should be limited so that torsion in the substrate holder is avoided. The use of the angular removal in conjunction with the spinning process substantially reduces mesa formation, e.g., from an average of 3 per substrate to 1 per substrate.

Additionally, the use of a shield or baffle below the lowest substrate has been found to significantly reduce the incidence of breakage normally encountered with the lower substrates. The shield or baffle acts as a means of maintaining the temperature gradient across the lower substrates at a level which prevents excessive thermal stress. It is contemplated that during removal of the substrates from the melt the substrates move through various temperature regions as they recede further from the melt surface. The entire substrate body begins to exchange heat with the cooler surrounds. However the temperature of the lower substrates continues to absorb heat radiated from the melt. Thus the lower substrates are heated from below by the melt and cooled from above by the other substrates. As the substrates are withdrawn further from the melt the difference in temperature on the substrate side and on the melt side of the last substrates becomes more and more divergent. Eventually the differences in temperature cause cracking of the substrate. The insertion of a means for shielding the lower substrates from the heat radiated from the melt prevents a large temperature gradient across the substrate and cracking is prevented.

It might be noted that a baffle useful for the thermal shielding purpose may be the same baffle used to prevent pits in the lower substrate caused by solvent liquefication. Although different heat shielding and solvent protecting means are possible, it is advantageous to combine the functions in one body.

By using the steps outlined it is possible to simultaneously process multiple substrates, e.g., 30 substrates. Substrates in the same position in the column have a deviation in thickness and magnetic properties of about 2% and 1% respectively from run to run. Within the same run epitaxial layers have a deviation of 15% and 2% respectively in thickness and magnetic properties from the top substrate to the bottom in a 30 substrate column. Surface defects and microcrystalline formation are substantially avoided. The combination of each step enumerated above is necessary to achieve the best results. However, the use of any one particular step affords advantageous results compared to the prior art processes. The following example illustrates the techniques described for a typical garnet layer.

EXAMPLE

Thirty substrates having a nominal thickness of 20 mils were cut from a two inch diameter boule of composition $Gd_3Ga_5O_{12}$ with a flat of approximately ¾ in. on one side. After these wafers were cut using a diamond blade in an ID saw, they were lapped polished, and cleaned.

Figure 2:
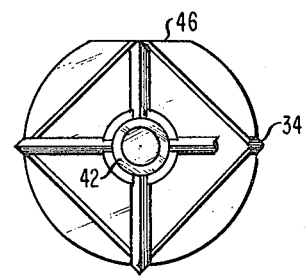
FIGS. 2 and 3 are a plan and front view of a substrate holder which is preferred for multisubstrate processing.
Figure 3:
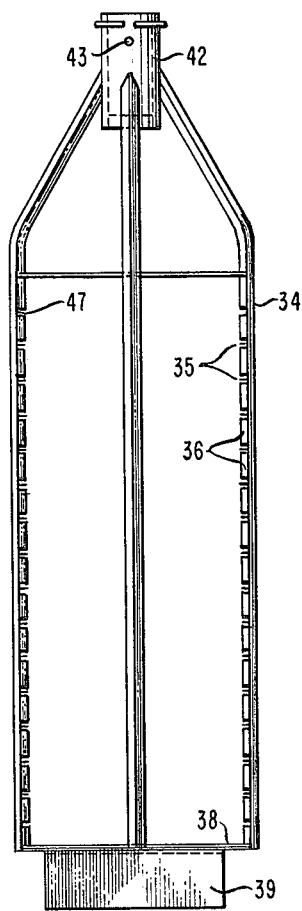

The thirty substrates were then loaded into the holder illustrated in FIGS. 2 and 3 so that the flat on each substrate, 46, engaged a slot in the holder. (A second shorter flat was made on the substrates to indicate the polished side but this flat was unnecessary for further processing.) The holder utilized was made from square support members, 34, with 100 mil sides. The material used for these support members was a composition of 95% platinum and 5% gold. The gold was added to preserve the rigidity of the structure at the temperatures utilized for typical melt compositions. The baffle, 38, at the bottom of the substrate holder, also 5% gold in platinum, had the same diameter as the substrates. Additionally, a stirrer 39 measuring two inches by one-half inch was attached to the bottom of the baffle. Slots in the horizontal members were positioned so that the minor spacing was 20 mils and the major spacing was 0.8 cm. The substrate holder with its substrates were then again cleaned to remove grit and organic matter from the holder members and further to remove any residual matter remaining on the substrates.

An alumina rod (8 in FIG. 1) was inserted into a tube member, 42, at the top of the substrate holder and held in place by inserting a platinum/gold wire into hole 43 both through the tube member and the rod. The alumina rod was then placed in a chuck which was a member of the raising and lowering means for the furnace. A mixture containing $CaO$, $GeO_2$, $Y_2O_3$, $Lu_2O_3$, $Sm_2O_3$, $Fe_2O_3$, $B_2O_3$, and $PbO$, in proportions specified by S. L. Blank, et al, in *Journal Electrochemical Society*, 123 (6), 856 (1976), was placed in the platinum crucible 10. This mixture was heated with continuous stirring to 1150 degrees C. for four hours. (Temperatures were controlled using various currents through heating wires 12 and a constant flow of water through cooling pipes, 14.) The melt temperature was then lowered to 1040 degrees C. while the substrates were being prepared as described above. When the substrates were ready for processing, the melt temperature was lowered to the growth temperature of 955 degrees C. The time which the furnace spends at 955 degrees C. before insertion of the substrates for growth should be no longer than is necessary to insure thermal equilibration in the melt. The holder was lowered approximately one foot into the furnace so that the top wafer was approximately aligned with the second platinum baffle, and was kept in this position for approximately one minute. The basket was again lowered so that the stirrer, 39, was just above the melt surface. In this position, the top of of the basket was aligned with the last baffle, 7. (The spacing between baffles starting from the space between the ultimate the penultimate baffle was about five inches, five inches, and two inches.) (Baffle 4 is fixed in place and supports baffles 5, 6, and 7.) The holder was kept in this position slightly above the melt for a time period of approximately five minutes so that preheating was accomplished. The holder was then lowered so that the stirrer on the baffle was inserted into the melt. The holder was then rotated at a speed between 90 and 100 rpm until the desired growth temperature, as indicated on thermocouple 11, was achieved.

The entire holder was then lowered into the melt composition so that the top substrate was approximately one inch below the surface of the melt. An oscillatory motion of the basket with its substrates was then initiated. This oscillating motion consists of rotating the substrates at 75 rpm through 360 degrees and then reversing the motion after each revolution. The oscillatory motion was continued for a growth period of 2.5 minutes, which yielded an average epilayer thickness of approximately 3.2 $\mu$m. The oscillatory motion was then stopped. The furnace and the substrates together were tilted to an angle of 15 degrees relative to the earth. The holder was then raised from the melt at a rate of ten inches per minute so that the point of the bottom substrate nearest the melt was approximately one inch above the melt.

The substrates were then held in this position for approximately 45 seconds to allow the flux to flow to the edge of the substrates. The furnace and substrates were then returned to their original untilted position. After the tilt was eliminated, the holder with its substrates were rotated at a rate approaching 1000 rpms. The spinning rate was limited so that wobbling or other torsional effects were avoided. The spinning was continued until no flux was observed on the substrates.

The holder, after spinning, was raised at a rate of 10 inches per minute until the top substrate was even with the third platinum baffle 6. The holder was kept in this position for approximately two minutes and then raised to align with the next baffle and again kept for two minutes. After this holding period, the basket was raised in steps of two inches every minute until the top of the basket was level with the first baffle, 4. The holder was then raised at a continuous rate of one-quarter inch per minute until it was removed from the furnace.

By using this procedure epilayers which varied in thickness and magnetic moment from top substrate to bottom substrate by about 14 and 2 percent respectively were obtained. (Use of the same procedure in subsequent runs with suitable adjustment in melt temperature to compensate for melt material used and to prevent microcrystalline formation, usually yielded an average less than about 3 percent change in thickness and magnetic moment between substrates in the same column position in sequential runs.)

I claim:

1. A process for the simultaneous production of garnet epilayers on a plurality of substrates in a growth apparatus, said growth apparatus comprising a melt body a means for heating said melt body, and a substrate holder means wherein said substrates are aligned by said holder means so that a non-planar configuration is obtained, comprising the steps of introducing and immersing said substrates in said melt body, growing the epilayers on said plurality of substrates and removing said plurality of substrates from said melt body so that the lower substrates in said holder emerge last from said melt CHARACTERIZED IN THAT said melt body is mixed before growth, that said lower substrates are shielded from heat radiation from said melt body upon removal from said melt body, and that the major surfaces of said substrates are parallel with the surface of said melt during growth of an epitaxial layer on said substrates in said melt body but leave said melt at an angle of 10 degrees or more to the surface of said melt.

2. The process of claim 1 wherein said melt body is mixed by a means affixed to said holder means.

3. The process of claim 1 wherein said lower substrates are shielded by a baffle affixed to said holder means.

4. The process of claim 1 wherein said angle is achieved by tilting said apparatus and said substrates.

5. The process of claim 1 wherein said melt body utilizes lead oxide as a solvent.

6. The process of claim 1 including the step of spinning said substrates upon removal from said melt body.

7. The process of claim 1 wherein said plurality of substrates is greater than 18.

8. The process of claim 1 including the step of shielding said substrates from solvents in said melt body.

9. The process of claim 1 including the step of preheating said substrates before they are immersed in said melt body.

* * * * *